(12) United States Patent
Klaeyle

(10) Patent No.: US 6,252,472 B1
(45) Date of Patent: Jun. 26, 2001

(54) MODULATOR HAVING LITTLE PARASITIC COUPLING

(75) Inventor: Philippe Klaeyle, Breteville l'Orgueilleuse (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/209,089

(22) Filed: Dec. 10, 1998

(30) Foreign Application Priority Data

Dec. 15, 1997 (FR) .................................................. 97 15878

(51) Int. Cl.$^7$ ....................................................... H04B 1/40
(52) U.S. Cl. ........................ 332/117; 332/123; 455/112; 455/118; 455/323; 455/86
(58) Field of Search ..................................... 332/117, 123; 455/112, 113, 118, 119, 86, 323; 331/37, 43; 327/115, 117

(56) References Cited

U.S. PATENT DOCUMENTS 5,097,230   3/1992   Lautzenhiser .......................... 332/127
5,463,356 * 10/1995  Palmer .................................. 332/117
5,568,205   10/1996  Hurwitz ................................ 348/723

OTHER PUBLICATIONS

Multifunction Silicon MMIC's for Frequency Conversion Applications by Kevin Negus et al. IEEE MTT, vol. 38, #9, pp. 1191–1198, 1986.*

Block Diagram TDA 8722, Philips Semiconductors,p. 3768, Mar. 21, 1995.

* cited by examiner

*Primary Examiner*—Arnold Kinkead
(74) *Attorney, Agent, or Firm*—Daniel J. Piotrowski

(57) ABSTRACT

The present invention relates to a modulator comprising an oscillator which has an oscillation frequency, and a mixer intended to supply a modulated signal with a given output frequency. According to the invention, the nominal oscillation frequency is N times higher than the output frequency, the modulator further including a frequency divider DIV/N intended to receive the output signal of the oscillator and to apply the carrier signal to the mixer, to produce a modulated signal with a first modulation frequency and a parasitic signal with a second modulation frequency.

5 Claims, 3 Drawing Sheets

MODULATOR HAVING LITTLE PARASITIC COUPLING

DESCRIPTION

1. Field of the Invention

The present invention relates to a modulator comprising:

an oscillator intended to generate a signal having a frequency called oscillation frequency, and a mixer intended to receive a modulating signal and a carrier signal, and to supply a modulated signal with a given output frequency.

2. Backgroung of the Invention

Such modulators are currently manufactured in the integrated circuit industry and used, for example, in magnetoscopes or decoders of digital television signals. The applicants market such an integrated circuit which is referenced TDA 8722. In this modulator, the carrier signal is formed by the signal generated by the oscillator and the modulated signal has a frequency equal to the oscillation frequency because the oscillator is directly connected to the mixer. It has been found that the oscillator and the output of the mixer interact by way of connections to energy sources shared by these two elements, on the one hand, and via electromagnetic radiation phenomena, on the other hand. This interaction has undesired effects. The oscillator induces in the modulated signal a parasitic signal, having the oscillation frequency, which is, due to the structure of the modulator, equal to the frequency of the carrier signal. The variations of the parasitic signal thus coincide with those of the modulated signal and modify the amplitude of the latter. The result is a modification of the envelope of the modulated signal which is equivalent to an alteration of the information transported by said signal.

An object of the present invention is to remedy this drawback by proposing a modulator whose structure is such that the effects of interaction between the oscillator and the output of the mixer may easily be eliminated.

SUMMARY OF THE INVENTION

Indeed, a modulator as defined in the opening paragraph is characterized according to the invention in that the oscillator is arranged so that its nominal oscillation frequency is N times higher than the output frequency, and in that the modulator further includes a divide-by-N frequency divider intended to receive the output signal of the oscillator and to apply the carrier signal to the mixer.

In such a modulator, the carrier signal is no longer the output signal of the oscillator, but the output signal of the frequency divider. As the frequency of the carrier signal is different from the oscillation frequency, the parasitic signal induced by the oscillator in the modulated signal has a frequency that is different from that of the modulated signal. The parasitic signal may thus easily be identified and filtered, for example, by means of a pass-band filter.

The modulator according to the invention further enables a modulated signal that features an improved spectral purity compared with that featured by the modulated signal generated by the known modulator. Indeed, the assembly of the oscillator as well as its connections to the rest of the circuit is to be perfectly symmetrical, so that it can deliver a signal which has a cycle ratio of ½. This condition of symmetry is very hard to realize in practice. The result is that the cycle ratio of the output signal of the oscillator cannot be exactly equal to ½, which notably causes the presence in this signal of a signal having a frequency of twice the oscillation frequency which is commonly called second harmonic. In the known modulator, this second harmonic appears in the modulated signal, since the output signal of the oscillator forms the carrier signal. In the modulator according to the invention, the carrier signal is formed by the output signal of a frequency divider whose precision of the cycle ratio may easily be mastered. Various embodiments may be considered for this object.

A particular embodiment of the invention features a modulator as described above, characterized in that, while the ratio N of the frequency division effected by the divider is equal to $2^P$, where P is an integer, the divider is formed by P divide-by-two dividers arranged in cascade, each of them including a first and a second memory flipflop which have each a control input as well as a data input and output, the control input of the first memory flipflop forming the input of the divide-by-two divider and being connected, via an inversion, to the control input of the second memory flipflop, the data output of the second memory flipflop being connected, via an inversion, to the data input of the first memory flipflop, the data output of the first memory flipflop being connected to the data input of the second memory flipflop, one of the data outputs of the first and second memory flipflops forming the output of the divide-by-two divider.

As stated above, a modulator in accordance with the invention may be advantageously used in various devices such as magnetoscopes or decoders of digital television signals. The invention thus also relates to a device used for the conversion of data into signals having a form that is compatible with television standards, comprising:

a unit called input unit intended to ensure the reception of the data and to extract therefrom signals of two different types, one called audio signal and the other called video signal, a first and a second processing module intended to reconstitute the audio and video signals, respectively, an adder intended to supply on an output a signal resulting from a superpositioning of signals present on the outputs of the first and second processing modules, and a modulator intended to perform a conversion of the frequency of the output signal of the adder into a given frequency, which device is characterized in that the modulator is such as described above, while its modulating signal is formed by the output signal of the adder.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1:
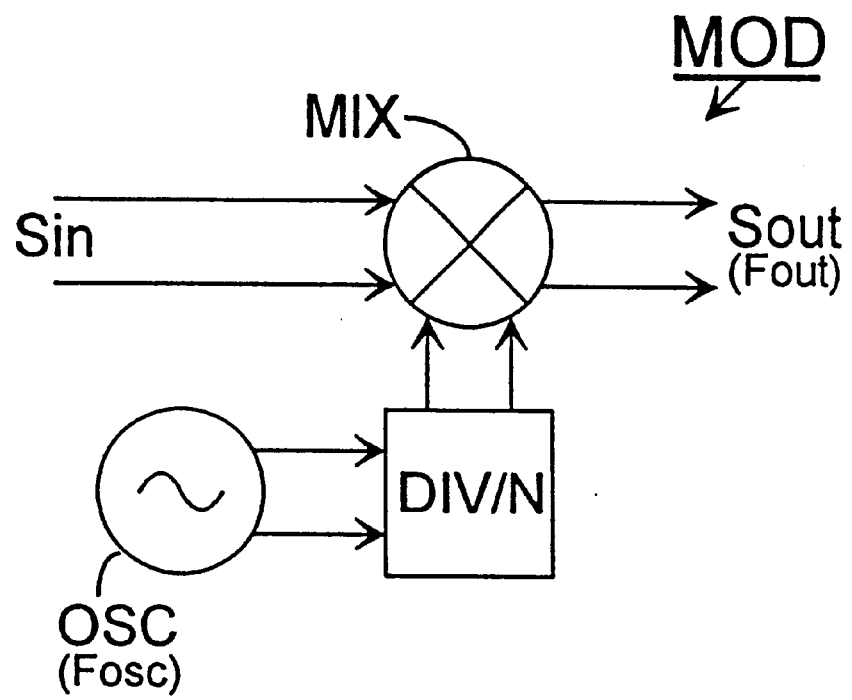
FIG. 1 is a partial function diagram describing a modulator according to the invention.

FIG. 1 partly represents a modulator MOD according to the invention. Such a modulator comprises:

an oscillator OSC intended to generate a signal which has a frequency called oscillation frequency Fosc, and a mixer MIX intended to receive a modulating signal Sin and a carrier signal, and to produce a modulated signal Sout having a given output frequency Fout.

The oscillator is arranged so that its nominal oscillation frequency Fosc is N times higher than the output frequency Fout. This is obtained by choosing values for the limits of the range of variations of the oscillation frequency Fosc which are N times higher than the limits of the range of variations of the output frequency Fout. The modulator MOD further includes a divide-by-N frequency divider DIV/N intended to receive the output signal of the oscillator OSC and to apply the carrier signal whose frequency is thus Fosc/N to the mixer MIX.

Figure 2:
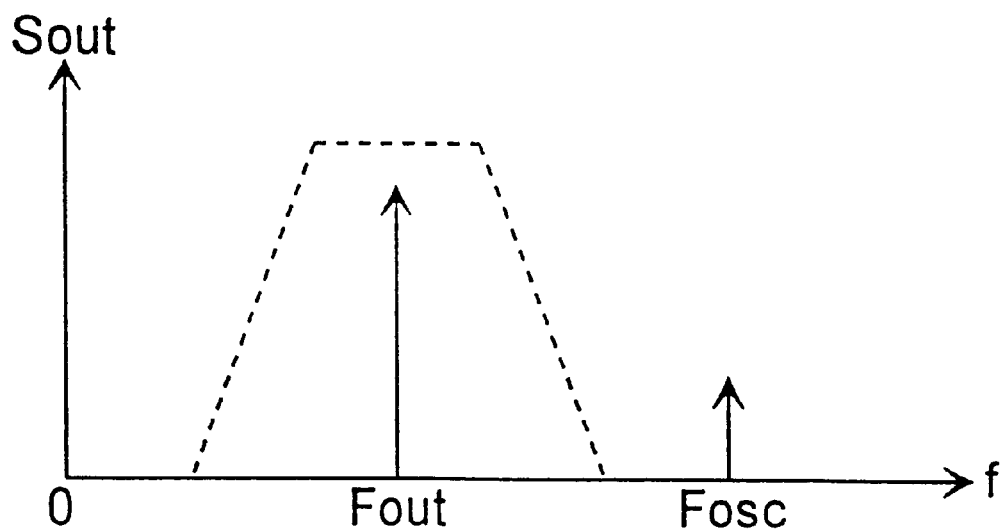
FIG. 2 is a spectral diagram describing a modulated signal generated by such a modulator.

FIG. 2 is a spectral representation of the output signal Sout of the modulator MOD according to the invention. It features at the output frequency Fout the main component of the modulated signal, and at the oscillation frequency Fosc a parasitic component resulting from an interaction which exists between the oscillator OSC and the output of the mixer MIX, which interaction is due to connections to energy sources shared by these two elements, on the one hand, and electromagnetic radiation phenomena, on the other hand. As the frequency of the carrier signal, which is the output frequency Fout, is N times lower than the oscillation frequency Fosc, the parasitic component induced by the oscillator OSC is separate from the main component of the modulated signal Sout and may easily be filtered out at the output of the modulator MOD, for example, by means of a pass-band filter of which a response curve is represented in the form of dotted lines in the Figure. Such a filtering is not possible for the output signal of the known modulator, for which the frequency of the carrier signal and thus that of the output signal Sout, is equal to the oscillation frequency Fosc (Fout=Fosc), which means that the parasitic components and main components of the modulated signal Sout are merged.

Figure 3:
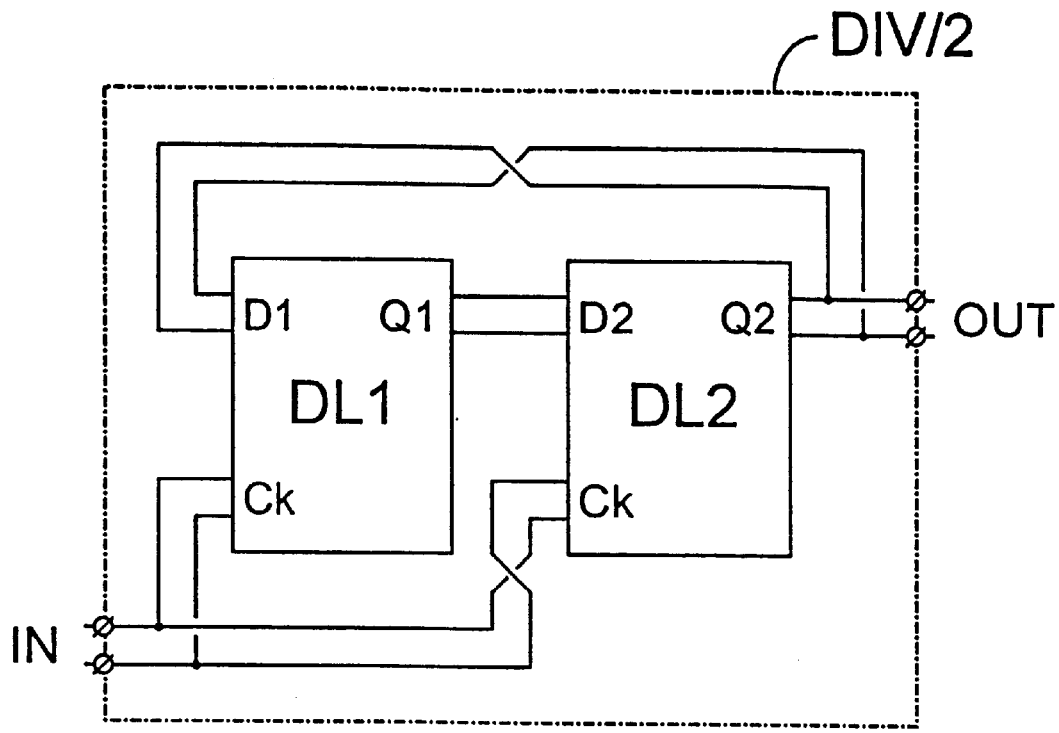
FIG. 3 is an electrical diagram describing a divide-by-two divider included in a frequency divider according to a particular embodiment of the invention.

FIG. 3 represents a divide-by-two divider DIV/2 included in a divide-by-N divider DIV/N in accordance with a particular embodiment of the invention. If the rate N of the frequency division carried out by the divider DIV/N is chosen to be equal to $2^P$, where P is an integer, the divider DIV/N will advantageously be formed by P divide-by-two dividers DIV/2 arranged in cascade. The dividing rate N may be chosen to be equal to 2 in which case the divider DIV/2 represented in the Figure forms in itself the frequency divider DIV/N shown in the FIG. 1. The divide-by-two divider DIV/2 includes a first and a second memory flipflop DL1 and DL2, of which each one has a control input Ck and a data input and data output D1, Q1 and D2, Q2, respectively. The control input Ck of the first memory flipflop DL1 forms the input IN of the divide-by-two divider DIV/2 and is connected, via an inversion, to the control input Ck of the second memory flipflop DL2. The data output Q2 of the second memory flipflop DL2 is connected via an inversion to the data input D1 of the first memory flipflop DL1. The data output Q1 of the first memory flipflop DL1 is connected to the data input D2 of the second memory flipflop DL2. The data output Q2 of the second memory flipflop DL2 forms the output OUT of the divide-by-two divider DIV/2.

Figure 4:
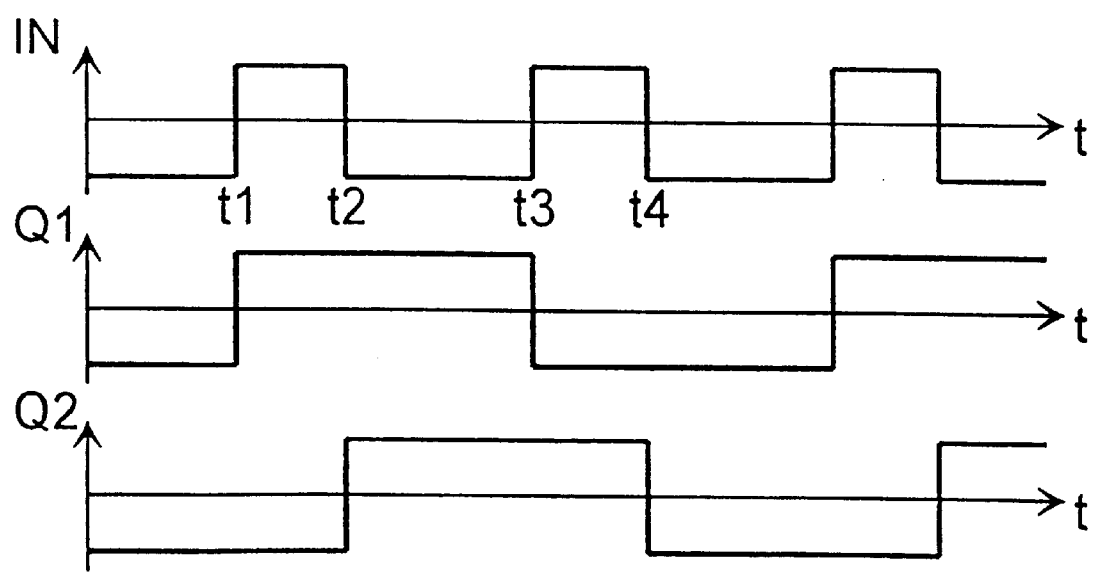
FIG. 4 is a set of timing diagrams describing the evolution of internal signals of such a divide-by-two divider.

FIG. 4 is a set of timing diagrams intended to illustrate the operation of such a frequency divider. These timing diagrams represent the evolution of signals present on the data outputs Q1 and Q2 of the first and second memory flipflops DL1 and DL2 in relation to variations of a signal present on the input IN of the divide-by-two divider DIV/2. If, for example, an initial state is chosen in which the signal present on the output Q2 of the second memory flipflop DL2 is negative when the signal present on the input IN of the divider DIV/2 is negative, this means that the signal present on the input D1 of the first memory flipflop DL1 is positive. When, at an instant t1, the input signal of the divider DIV/2 becomes positive, the first memory flipflop DL1 duplicates on its data output Q1 the positive state applied to its data input D1. This positive state is thus transmitted to the data input D2 of the second memory flipflop DL2. When, at an instant t2, the input signal of the divider DIV/2 becomes negative, the second memory flipflop DL2 duplicates on its data output Q2 the positive state applied to its data input D2, which means that the signal present on the input D1 of the first memory flipflop DL1 becomes negative. Following a reasoning in analogy with that developed above, when at an instant t3 the input signal of the divider DIV/2 again becomes positive, the signal present on the output Q1 of the first memory flipflop DL1 becomes negative and is transmitted to the data input D2 of the second memory flipflop DL2 and when, at an instant t4, the input signal of the divider DIV/2 again becomes negative, the signal present on the output Q2 of the second memory flipflop DL2 again becomes negative and a new cycle may commence.

In order to better illustrate the advantages provided by such a divide-by-two divider, the cycle ratio of the signal present on the input IN of the divide-by-two divider DIV/2, which is equal to (t2−t1)/(t3−t1), has deliberately been chosen to differ from ½. If a signal of this form were directly sent to the mixer, as may be the case in the known modulator because the cycle ratio of the output signal of the oscillator directly depends on the symmetry of the latter, which symmetry is very difficult to master perfectly, even harmonics would appear in the modulated signal and, more particularly, a second harmonic having a frequency that is twice the oscillation frequency, causing a degradation of the spectral purity of the modulated signal. In the modulator according to the invention, it is the output signal of the frequency divider that forms the carrier signal. It clearly appears from the timing diagrams featured above that the cycle ratio of the output signal of such a frequency divider may be easily controlled, notably thanks to the use of a loop structure of the type described in FIG. 3. The spectral purity of the modulated signal thus no longer runs the risk of being degraded because of a quasi-unavoidable dissymmetry of the oscillator, since the frequency divider itself re-establishes a cycle ratio exactly equal to ½ for its output signal.

Figure 5:
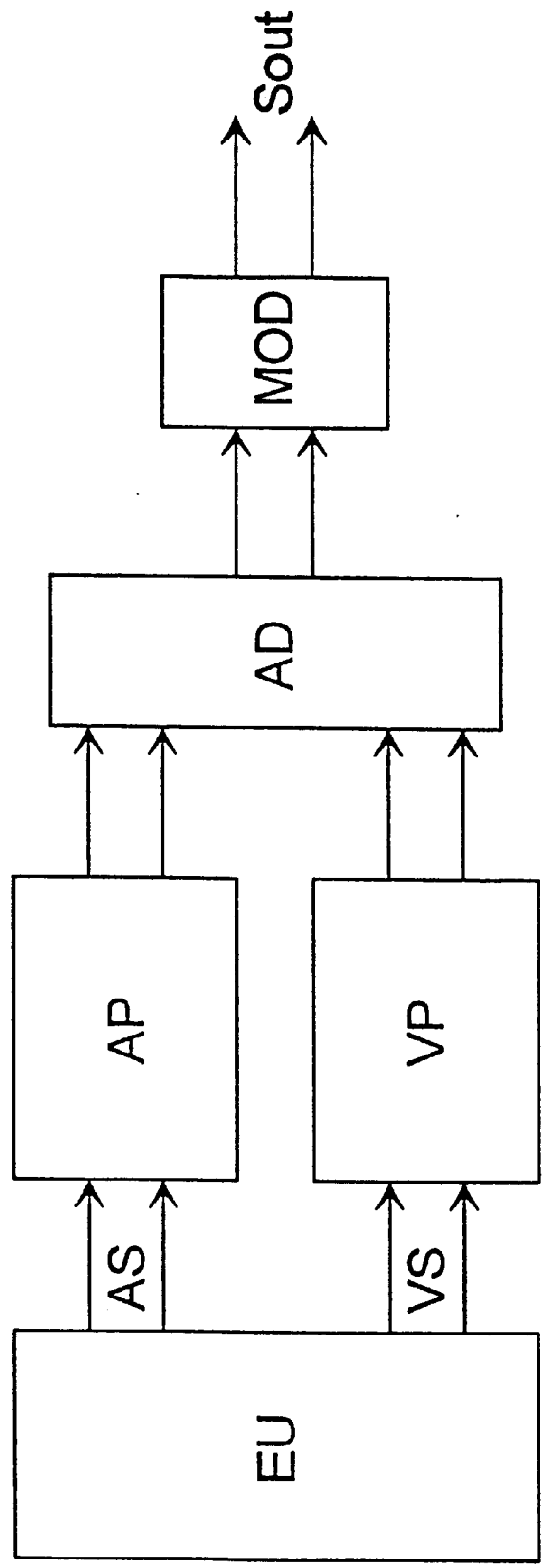
FIG. 5 is a partial function diagram describing a signal converter integrating a modulator according to the invention.

FIG. 5 describes in a highly diagrammatic manner a device used for the conversion of data into signals which have a form that is compatible with the television standards, comprising:

a unit EU called input unit intended to ensure the reception of information and to extract therefrom signals AS and VS of two different types, one called audio signal and the other called video signal, a first and a second processing module AP and VP, intended to reconstitute the audio and video signals AS and VS, an adder AD intended to deliver on an output a signal resulting from a superpositioning of signals present on the outputs of the first and second processing modules AP and VP, and a modulator MOD intended to perform a conversion of the frequency of the output signal of the adder into a given frequency, its modulating signal being formed by the output signal of the adder AD.

The structure described above forms a basic architecture for receiving and converting units used in magnetoscopes or receivers of digital television signals. If the device is intended for the reception of such digital signals, the input unit EU will preferably include a unit for decrypting and demultiplexing the received signal, thus generating thus the audio and video signals AS and VS in compressed form, for example, according to an MPEG standard, which compressed signals will then thereafter be decompressed and converted into analog form inside the processing units AP and VP before being recombined by the adder AD. The processing unit AP of the audio signal AS may advantageously perform an amplitude or frequency modulation of said audio signal AS. The modulation performed by the modulator MOD according to the invention enables to recreate a signal in accordance with the conventional television standards, without modifying the information transported by the signal, or degrading its spectral purity.

What is claimed is:

1. A modulator comprising:
   an oscillator intended to generate a signal having a frequency called oscillation frequency, and
   a mixer intended to receive a modulating signal and a carrier signal, and to supply a modulated signal with a given output frequency,
   wherein the oscillator is arranged so that its nominal oscillation frequency is N times higher than the output frequency, and
   a divide-by-N frequency divider intended to receive the output signal of the oscillator and to apply the carrier signal to the mixer, to produce a modulated output signal with a first modulation frequency and a parasitic signal with a second modulation frequency wherein a cycle ratio of the divider output signal can be controlled to a void dissymetry of the oscillator signal.

2. A modulator as claimed in claim 1, characterized in that, while the ratio N of the frequency division effected by the divider is equal to $2^P$, where P is an integer, the divider is formed by P divide-by-two dividers arranged in cascade, each of them including a first and a second memory flipflop which have each a control input as well as a data input and output, the control input of the first memory flipflop forming the input of the divide-by-two divider and being connected, via an inversion, to the control input of the second memory flipflop, the data output of the second memory flipflop being connected, via an inversion, to the data input of the first memory flipflop, the data output of the first memory flipflop being connected to the data input of the second memory flipflop, one of the data outputs of the first and second memory flipflops forming the output of the divide-by-two divider.

3. A device used for converting data into signals having a form that is compatible with television standards, comprising:
   a unit called input unit intended to ensure the reception of the data and to extract therefrom signals of two different types, one called audio signal and the other called video signal,
   a first and a second processing module intended to reconstitute the audio and video signals, respectively,
   an adder intended to supply on an output a signal resulting from a superpositioning of signals present on the output of the first and second processing modules, and
   a modulator intended to perform a conversion of the frequency of the output signal of the adder into a given frequency, the modulator including,
   an oscillator intended to generate a signal having a frequency called oscillation frequency,
   a mixer intended to receive a modulating signal and a carrier signal, and to supply a modulated signal with a given output frequency, wherein the oscillator is arranged so that its nominal oscillation frequency is N times higher than the output frequency, and
   a divide-by-N frequency divider intended to receive the output signal of the oscillator and to apply the carrier signal to the mixer, to produce a modulated output signal with a first modulation frequency and a parasitic signal with a second modulation frequency wherein a cycle ratio of the divider output signal can be controlled to avoid dissymetry of the oscillator signal.

4. The modulator of claim 1 wherein the parasitic signal has a modulation frequency substantially equal to the oscillation frequency.

5. The modulator of claim 4 further including a filter to filter the parasitic signal.

* * * * *